(12) United States Patent
Lee et al.

(10) Patent No.: US 6,710,439 B2
(45) Date of Patent: Mar. 23, 2004

(54) THREE-DIMENSIONAL POWER SEMICONDUCTOR MODULE AND METHOD OF MANUFACTURING THE SAME

(75) Inventors: Keun-hyuk Lee, Seoul (KR); Gi-Young Jeun, Bucheon (KR); O-seob Jeon, Seoul (KR)

(73) Assignee: Fairchild Korea Semiconductor Ltd., Kyungki (KR)

( * ) Notice: Subject to any disclaimer, the term of this patent is extended or adjusted under 35 U.S.C. 154(b) by 0 days.

(21) Appl. No.: 10/244,101

(22) Filed: Sep. 12, 2002

(65) Prior Publication Data

US 2003/0067065 A1 Apr. 10, 2003

(30) Foreign Application Priority Data

Sep. 17, 2001 (KR) .......................................... 2001-57177

(51) Int. Cl.$^7$ ............................................. H01L 23/52
(52) U.S. Cl. ..................... 257/691; 257/666; 257/724; 438/110
(58) Field of Search ................. 257/691, 676, 257/666, 723, 724, 686; 438/110, 111, 107

(56) References Cited

U.S. PATENT DOCUMENTS

| | | | |
|---|---|---|---|
| 5,131,095 A | * | 7/1992 | Tagawa et al. |
| 5,434,449 A | * | 7/1995 | Himeno et al. |
| 5,471,089 A | | 11/1995 | Nagatomo et al. |
| 5,521,437 A | | 5/1996 | Oshima et al. |
| 5,703,399 A | * | 12/1997 | Majumdar et al. |
| 5,767,573 A | * | 6/1998 | Noda et al. |
| 5,792,676 A | * | 8/1998 | Masumoto et al. |
| 5,998,856 A | * | 12/1999 | Noda et al. |
| 6,002,166 A | | 12/1999 | Noda et al. |
| 6,060,772 A | * | 5/2000 | Sugawara et al. |
| 6,313,520 B1 | * | 11/2001 | Yoshida et al. |
| 6,432,750 B2 | * | 8/2002 | Jeon et al. |
| 6,541,851 B2 | * | 4/2003 | Sadaki et al. |

FOREIGN PATENT DOCUMENTS

JP 9008223 1/1997

* cited by examiner

*Primary Examiner*—Sheila V. Clark
(74) *Attorney, Agent, or Firm*—Townsend and Townsend and Crew LLP

(57) ABSTRACT

A power semiconductor module in which a main circuit terminal lead frame part and a control circuit lead frame part are bent toward a main circuit lead frame part, is provided. The power semiconductor module includes a main circuit part; a control circuit part and a control circuit terminal which are placed along a plane perpendicular to the main circuit part; a main circuit terminal placed along another plane perpendicular to the main circuit part, facing the control circuit part the control circuit terminal; a bonding wire; and a mold compound. Accordingly, it is possible to realize a light and compact intelligent power module that is simple to manufactured at a low cost.

21 Claims, 20 Drawing Sheets

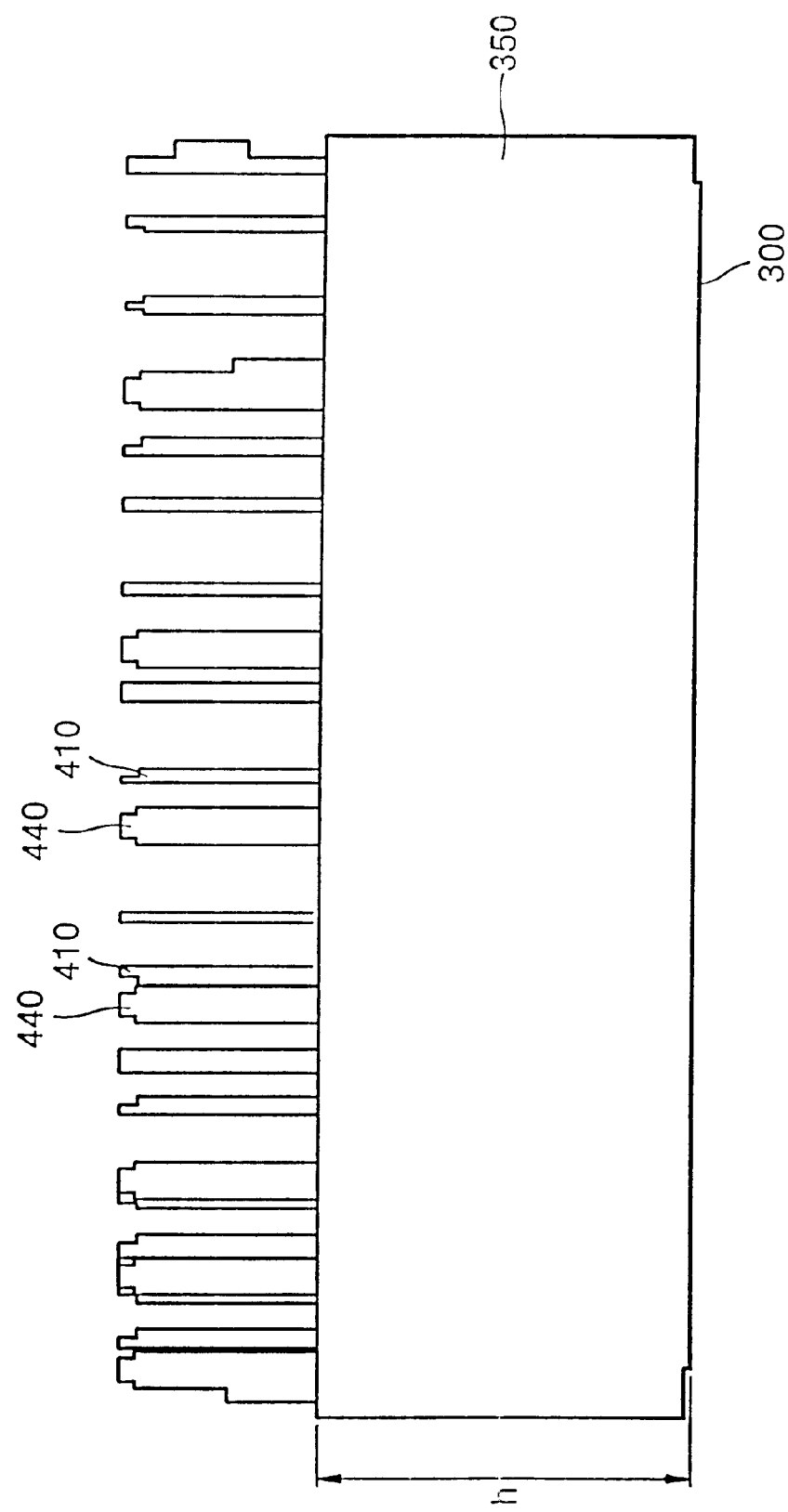

THREE-DIMENSIONAL POWER SEMICONDUCTOR MODULE AND METHOD OF MANUFACTURING THE SAME

BACKGROUND OF THE INVENTION

1. Field of the Invention

The present invention relates to a power semiconductor module, and more particularly, to a power semiconductor module in which a main circuit terminal lead frame part and a control circuit lead frame part are bent toward a main circuit lead frame part.

2. Description of the Related Art

Advancement in the power electronics industry, e.g., inverters and servo drivers, triggers a need for a light and compact power system that is manufactured at a low cost and operates more efficiently. To realize such a power system, electronic components are integrated into one package, i.e., a power semiconductor module, and a large number of power devices and control integrated circuits (IC), which control the power devices, are integrated into one power semiconductor module that is capable of controlling and protecting power devices. This power semiconductor module is called an 'intelligent power module'.

FIGS. 1 through 3 are views of conventional power semiconductor modules. FIG. 1 is a view of a semiconductor package disclosed in U.S. Pat. No. 6,002,166. Referring to FIG. 1, all components (some not shown) such as a semiconductor device and a control circuit device are combined with one another by solder (not shown), and a semiconductor chip 1 attached to a lead frame (not shown) is electrically connected with a terminal 5 by a bonding wire (not shown). The size of the semiconductor package of FIG. 1 is determined according to the sizes of all components attached to the lead frame. Thus, an increase in the number of components required results in an increase in the size of the semiconductor package. As the size of the semiconductor package increases, more components, such as a substrate and a mold compound, are required in fabricating the semiconductor package, thus increasing manufacturing costs therefor. Also, in the semiconductor package, the distance between a base substrate 3, which contacts a heat sink (not shown), and a terminal 5 extended to the exterior of a mold compound 7, which molds the semiconductor package, is approximately 4–5 mm. In other words, the isolation height h, which is the distance between the terminal 5 connected to the exterior circuit and the heat sink, is about 4–5 mm. Therefore, the isolation height of the semiconductor package is lower than the UL (underwriters laboratory) standard, i.e., 12.7 mm. If the isolation height is below the UL, the electrical insulation of a semiconductor package deteriorates.

FIG. 2 is a view of a semiconductor package disclosed in U.S. Pat. No. 5,521,437. Referring to FIG. 2, all components are attached to an insulated metal substrate 16 and are electrically connected to one another by a bonding wire 18. Thus, the size of the semiconductor package is determined by the size of the insulated metal substrate 16 to which all components are attached. That is, an increase in the number of the components required results in an increase in the size of the semiconductor package. Also, as the size of the semiconductor package increases, a great number of components, such as an insulated metal substrate and a mold compound, are required in fabricating the semiconductor package, thus raising manufacturing costs therefor. In FIG. 2, reference numerals 11, 13, 15, 17 and 19 denote a case, a control circuit terminal, a main circuit terminal, a main circuit part, and a control circuit unit, respectively.

FIG. 3 is a view of a semiconductor package disclosed in U.S. Pat. No. 5,471,089. Referring to FIG. 3, a main circuit part 35 having a power semiconductor device and a control circuit part 33 including a control circuit device are formed on different substrates. The main circuit part 35 and the control circuit part 33 are installed at the top and bottom of the semiconductor package, respectively. Also, they are connected to each other by a metal connection 37. Portions of the main circuit part 35 and the control circuit part 33 that contact the metal connection 37 are soldered by a solder 32. In conclusion, in the semiconductor package shown in FIG. 3, the main circuit part 35 and the control circuit part 33 are formed on different substrates at the top and bottom of the semiconductor package. Also, the metal connection 37 and the solder 32 are indispensable in connecting the main circuit part 35 with the control circuit part 33. Accordingly, it is very difficult to realize such a semiconductor package. Here, reference numerals 31 and 39 denote a terminal and a case, respectively.

BRIEF SUMMARY OF THE INVENTION

To solve the above problem, it is a first objective of the present invention to provide a light and compact power semiconductor module that is simple to manufacture at a lower cost.

It is a second objective of the present invention to provide a method of fabricating such a power semiconductor module.

Accordingly, to achieve an aspect of the first objective, there is provided a three-dimensional power semiconductor module according to an embodiment of the present invention. The power semiconductor module includes a main circuit part mounted on an isolation substrate and including a power semiconductor device; a control circuit part positioned along a plane, forming a predetermined angle to the main circuit part, the control circuit part attached to a control circuit device; a control circuit terminal connected to the control circuit part; a main circuit terminal positioned along another plane, forming a predetermined angle to the main circuit part; a bonding wire for electrically connecting the control circuit terminal, the control circuit device, the power semiconductor device, and the main circuit terminal; and a mold compound for completely molding the main circuit part and the control circuit part.

Preferably, the main control part is attached to the isolation substrate by an adhesive, and the control circuit part is positioned along a plane perpendicular to the main circuit part.

Preferably, the control circuit terminal is positioned along the same plane as the control circuit part.

Preferably, the main circuit terminal is placed along a different plane, making it symmetrical with the control circuit part with reference to the main circuit part.

Preferably, the main circuit part and the control circuit part are completely molded by the mold compound such that a trench is formed in a space between the control circuit terminal and the main circuit terminal.

Preferably, an impulse buffer agent is formed at the ends of the bonding wire.

To achieve another aspect of the first objective, there is provided a three dimensional power semiconductor module. The power semiconductor module includes a main circuit part mounted on an isolation substrate and including a power semiconductor device thereon; a control circuit part placed along a plane perpendicular to the main circuit part such that a control circuit device turns toward the power semiconductor device included in the main circuit part, the control circuit part including the control circuit device; a control circuit terminal placed along the same plane as the control circuit part, the control circuit terminal connected to the control circuit part; a main circuit terminal positioned along a different plane perpendicular to the main circuit part, facing the control circuit part and the control circuit terminal; a bonding wire for electrically connecting the control circuit terminal, the control circuit terminal, the power semiconductor device, and the main circuit terminal; and a mold compound for molding the main circuit part, the control circuit part, a portion of the main circuit terminal, and the entire isolation substrate, excluding its lower part, thereby conforming the module into a hexahedral shape.

Preferably, the main circuit part is bonded to the isolation substrate by an adhesive.

Preferably, an impulse buffer agent is formed at the ends of the bonding wire.

To achieve still another aspect of the first objective, there is provided a three dimensional power semiconductor module. The power semiconductor module includes a main circuit part mounted on an isolation substrate and including a power semiconductor device; a control circuit part placed along a plane perpendicular to the main circuit part such that a control circuit device turns toward the power semiconductor device in the main circuit part, the control circuit part including the control circuit device; a control circuit terminal placed along the same plane as the control circuit part and connected to the control circuit part; a main circuit terminal placed along a different plane perpendicular to the main circuit part, facing the control circuit part and the control circuit terminal; a bonding wire for electrically connecting the control circuit terminal, the control circuit device, the power semiconductor device, and the main circuit terminal, the bonding wire including an impulse buffer agent at its end; and a mold compound for molding the main circuit part, the control circuit part, a portion of the main circuit terminal, and the entire substrate, excluding its lower portion, such that a trench is formed in a space between the control circuit part and the main circuit terminal.

To achieve the second objective, there is provided a method of fabricating a three-dimensional power semiconductor module, including the steps of: (a) making a lead frame having notches in its bending regions, the lead frame including a control circuit terminal lead frame part, a control circuit lead frame part, a main circuit lead frame part, and a main circuit terminal lead frame part; (b) attaching a power semiconductor device to the main circuit lead frame part, attaching a control circuit device to the control circuit lead frame part, and performing wire bonding thereon; (c) bending the control circuit terminal lead frame part, the control circuit lead frame part, and the main circuit terminal lead frame part at the respective bending regions; (d) mounting the control circuit lead frame part on an isolation substrate, and then molding the lead frame and the isolation substrate; and (e) trimming the lead frame.

Preferably, the bending regions includes a first bending region that is a border between the main circuit lead frame part and the control circuit lead frame part; and a second bending region that is a border between the main circuit terminal lead frame part functioning as a main circuit terminal and the main circuit lead frame part, the second bending region being connected to the main circuit lead frame part.

Preferably, the step (b) further includes forming an impulse buffer agent on the metal connections of the bonding wire after the wire bonding.

Preferably, in the step (d), the control circuit lead frame part is mounted on the isolation substrate after soldering on the isolation substrate.

A semiconductor power module according to the present invention is configured such that a main circuit terminal lead frame part and a control circuit lead frame part are bent from a main circuit lead frame part, thereby reducing its size and weight, and manufacturing cost therefor. Also, a process of fabricating the power semiconductor module can be simplified. Further, it is possible to sufficiently increase the height of an isolation between an outer connection terminal and a heat sink.

BRIEF DESCRIPTION OF THE DRAWINGS

The above objectives and advantages of the present invention will become more apparent by describing in detail preferred embodiments thereof with reference to the attached drawings in which:

FIGS. 4 through 11B are views for explaining a method of fabricating a three dimensional power semiconductor module according to a preferred embodiment of the present invention and the structure thereof.

DETAILED DESCRIPTION OF THE INVENTION

Figure 1:
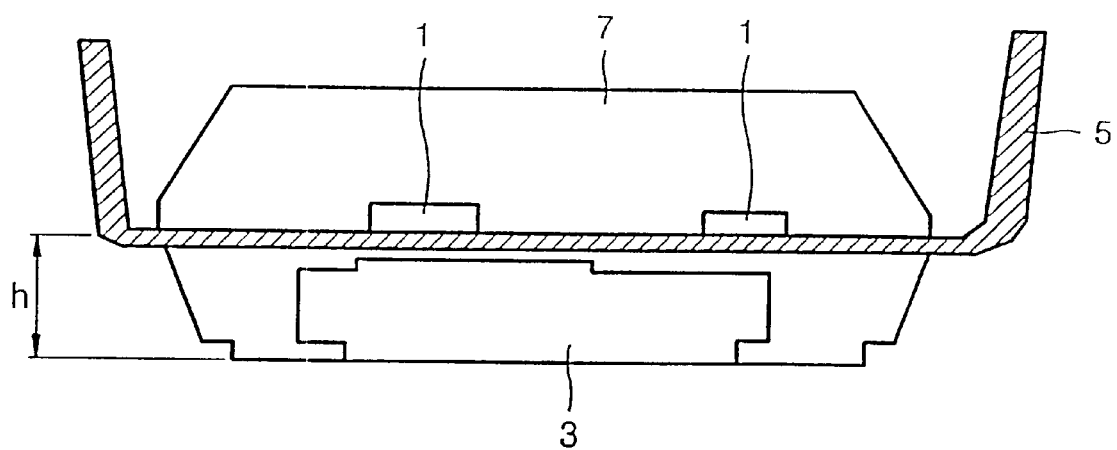
FIGS. 1 through 3 are views of conventional power semiconductor modules.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same elements so that descriptions of the elements.

A power semiconductor module according to a preferred embodiment of the present invention includes a main circuit part having a power semiconductor device and a control circuit part having a control circuit device. The power semiconductor module can be applicable to inverters, converters, and dynamic brakes. The power semiconductor device may include a power MOSFET (metal oxide semiconductor field effect transistor). The power MOSFET is preferably a vertical power MOSFET. A vertical power MOSFETs has a source region and a gate region at one side of a semiconductor die while the drain region is at the other side of the semiconductor die. In operation, current passes vertically through the semiconductor die. A vertical MOSFET may also have a planar or trenched gate region. Trenched gate regions are preferred in some embodiments.

Hereinafter, a power semiconductor module according to the present invention will be now described with reference to FIGS. 11A, 11B, 13A, and 13B, and a method of fabricating the power semiconductor module will be later described with reference to FIGS. 4 through 13B.

Figure 11B:
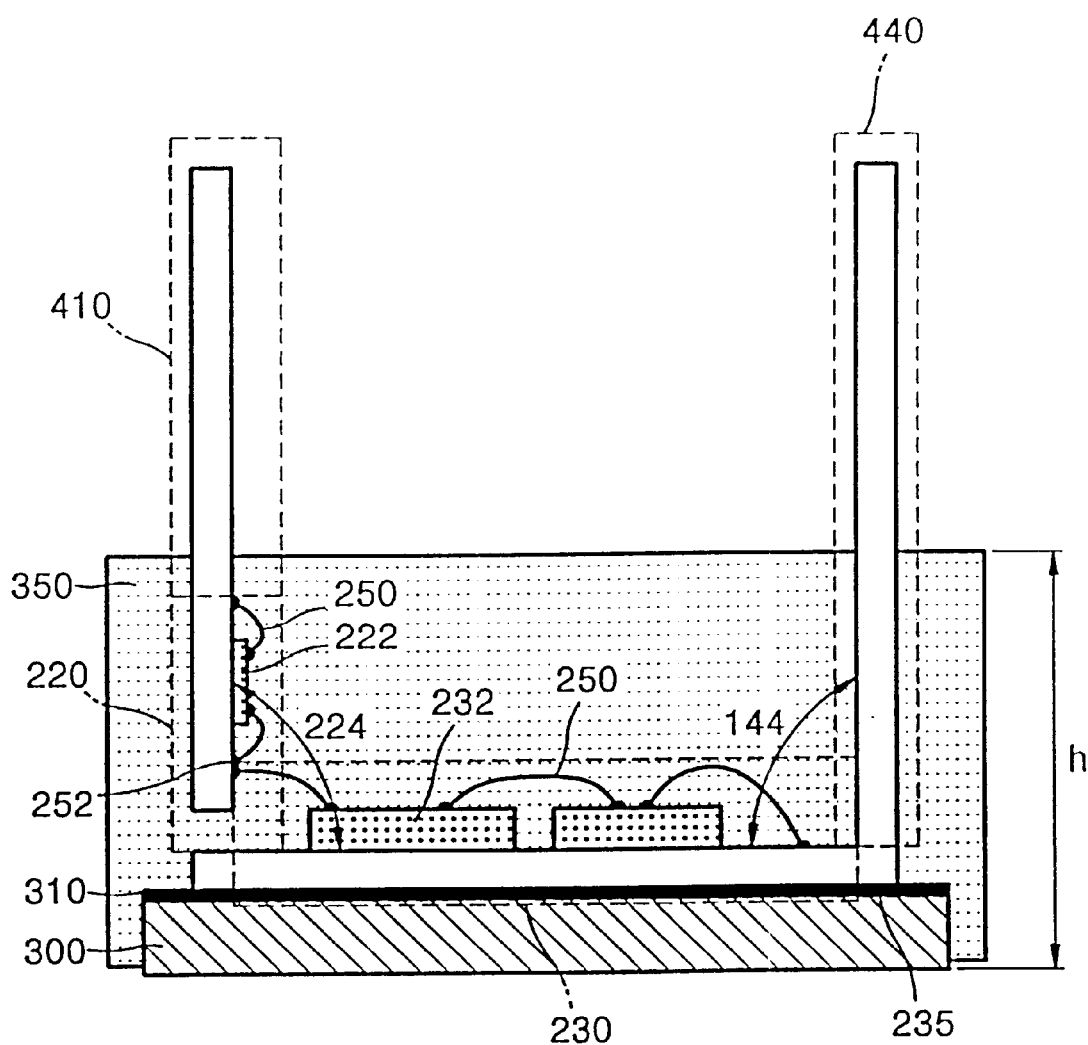

FIGS. 11A and 11B are views of a power semiconductor module according to a preferred embodiment of the present invention. In detail, FIG. 11A is a front view of the power semiconductor module, and FIG. 11B is a cross sectional view of the left side thereof Referring to FIGS. 11A and 11B, the power semiconductor module includes a main circuit part 230, a control circuit part 220 and control circuit terminals 410 which are placed perpendicular at one portion of the main circuit part 230, main circuit terminals 440 which are placed perpendicular at another portion of the main circuit part 230, facing the control circuit part 220 and the control circuit terminals 410, a bonding wire 250, and a mold compound 350 formed to conform the power semiconductor module to a hexahedron. As shown in FIG. 11B, the mold compound 350 encapsulates the control circuit part 220, the main circuit part 230, and part of the isolation substrate 300 (except for a lower portion of the isolation substrate 300). Also, as shown in FIG. 11B, in this embodiment, the main circuit terminals 440 and the control circuit terminals 410 extend out of the mold compound 350 and are substantially parallel to each other.

The main circuit part 230 has a structure in which a power semiconductor device 232 is attached to a main circuit lead frame (not shown). The main circuit part 230 is mounted on an isolation substrate 300. The isolation substrate 300 and the main circuit part are placed firmly in contact with each other by the mold compound 350. The main circuit part 230 maybe bonded to the isolation substrate 300 by an adhesive 310.

In the control circuit part 220, a control circuit device 222 is attached to a control circuit lead frame (not shown). The control circuit part 220 is positioned perpendicular at a portion of the main circuit part 230 so that the control circuit device 222 included therein faces the power semiconductor device 232 in the main circuit part 230. However, it is possible to position the control circuit part 220 such that it forms an acute angle or obtuse angle with the main circuit part 230 if necessary.

The control circuit terminal 410 is directly connected to the control circuit part 220 and thus, preferably placed along the same vertical plane as the control circuit part 220. The control circuit terminal 410 is electrically connected to the control circuit device 222 by the bonding wire 250, allowing an electrical signal to be transmitted to the outside.

The main circuit terminal 440 is placed on a plane perpendicular to the main circuit part 230 that is a different from the vertical plane along which the control circuit part 220 is positioned. Also, the main circuit terminal 440 faces the control circuit part 220. The main circuit terminal 440 is electrically connected to the power semiconductor device 232 formed on the main circuit part 230.

The bonding wire 250 electrically connects the control circuit terminal 410 to the control circuit device 222, and the control circuit device 222 to the power semiconductor device 232. Also, it electrically connects the power semiconductor device 232 and the control circuit terminal 440. It is preferable that an impulse buffer agent 252 is formed at the ends of the bonding wire 250. The impulse buffer agent 252 prevents the bonding wires 250 from detaching from the main circuit part 230, the control circuit part 220, and the control circuit terminal 410 when an impulse is imparted to the connections which the bonding wires 250 are connected therewith. Therefore, it is preferable that the impulse buffer agent 252 is formed of a silicon based rubber or polyamide.

The mold compound 350 molds the main circuit part 230, the control circuit part 220, a portion of the main circuit terminal 440, a lower portion of the control circuit terminal 410, and the entire isolation substrate 300 except for a lower portion thereof, thereby shaping the power semiconductor module into a hexahedron.

Figure 13A:
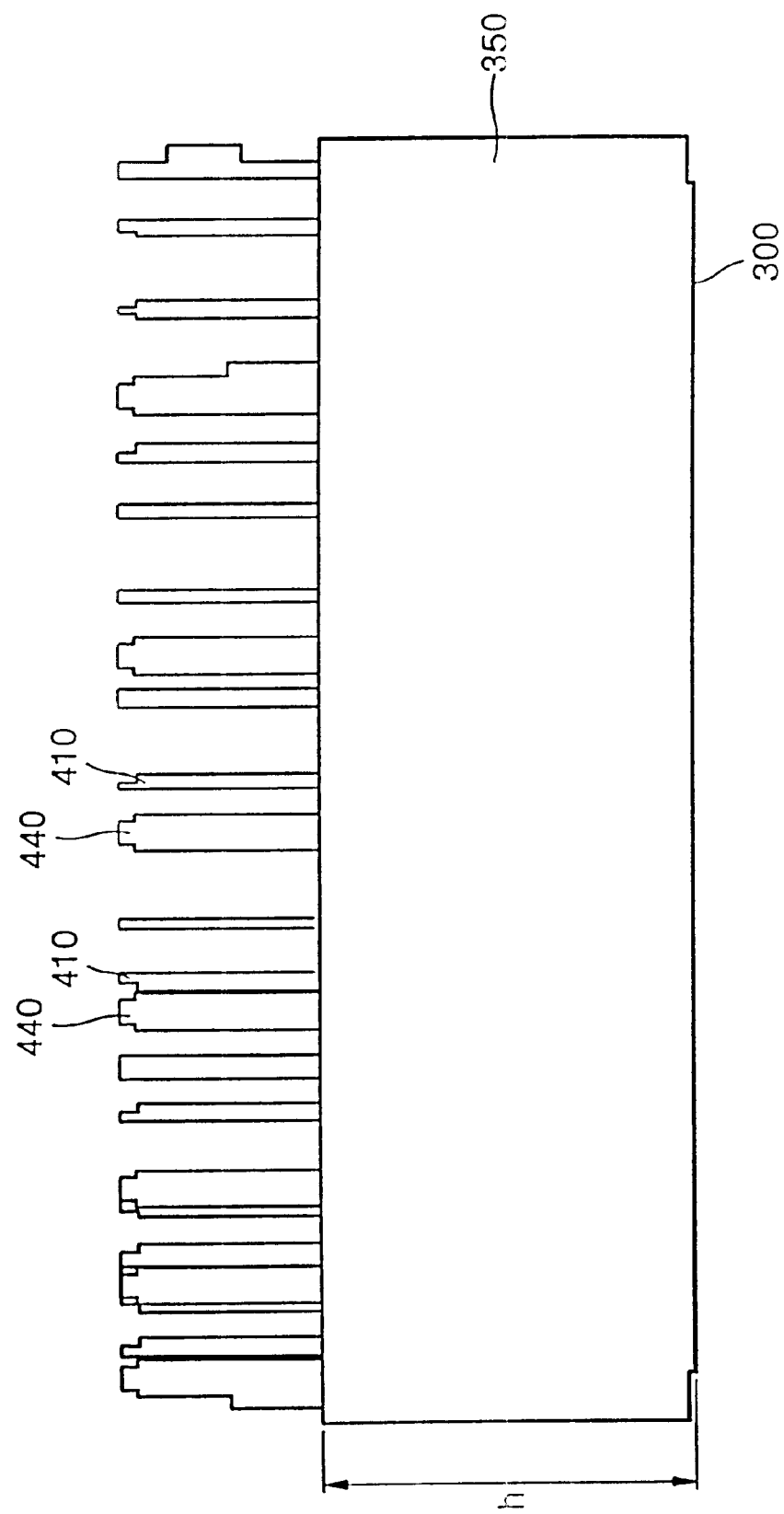
Figure 13B:
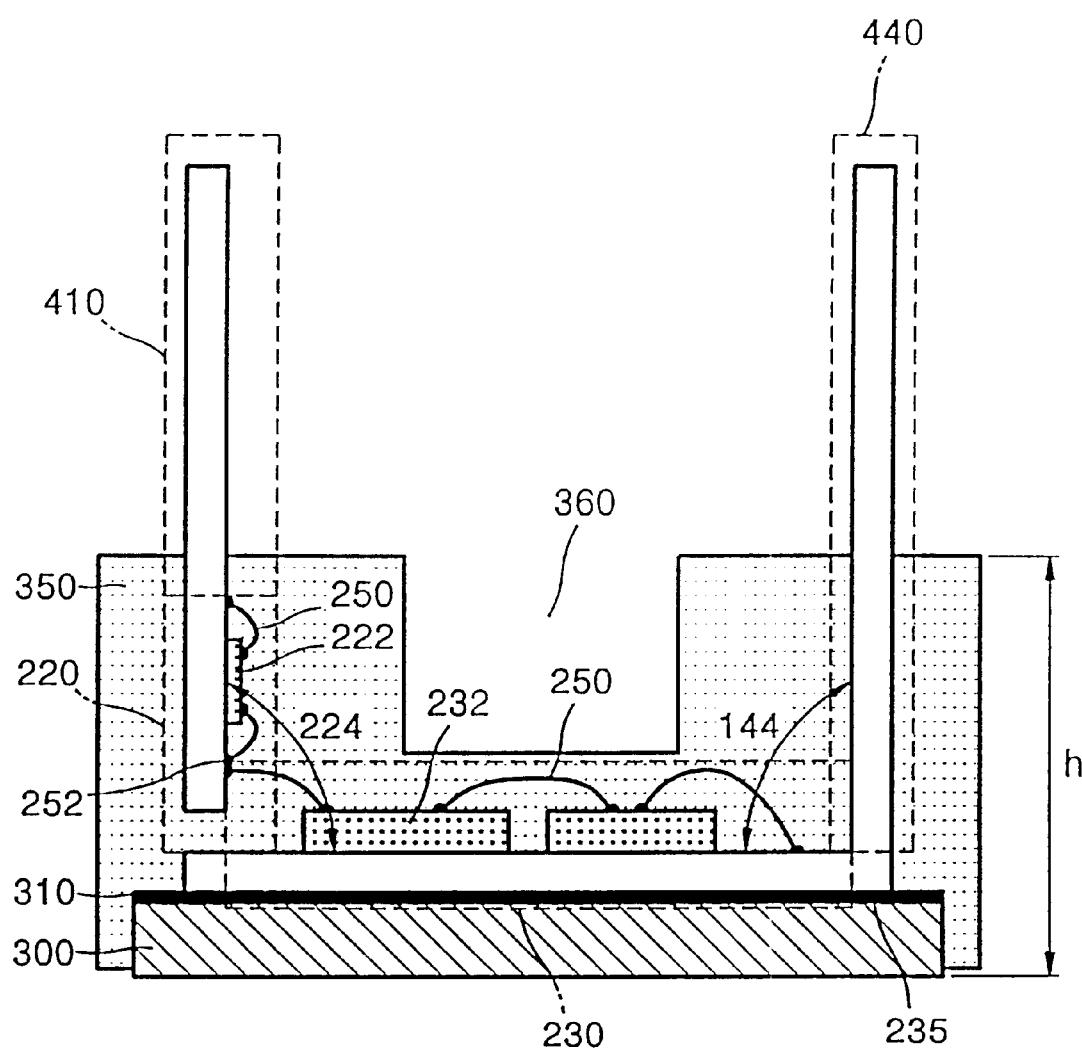

FIGS. 13A and 13B are views of a power semiconductor module according to a modified example of the embodiment shown in FIGS. 11A and 11B. FIG. 13A is a front view of the power semiconductor module and FIG. 13B is a cross sectional view of the left side thereof. In comparison with the components in the semiconductor power module shown in FIGS. 11A and 11B, those of the semiconductor power module in FIGS. 13A and 13B, except for a mold compound, are the same in terms of structure, function, and effects and thus their explanations will be omitted here.

Referring to FIGS. 13A and 13B, the power semiconductor module includes a main circuit part 230, an isolation substrate 300; a control circuit part 220 and a control circuit terminal 410 that are placed along a plane perpendicular to the main circuit part 230, a main circuit terminal 440 that is placed along another plane perpendicular to the main circuit part 230 and faces the control circuit part 220 and the control circuit terminal 410, a bonding wire 250, and a mold compound 350 having a trench 360 between the control circuit part 220 and the main circuit terminal 440.

The power semiconductor module shown in FIGS. 13A and 13B is characterized in that the mold compound 350 molds the main circuit part 230, the control circuit part 220, a portion of the main circuit terminal 440, a portion of the control circuit terminal 410, and the entire isolation substrate 300, except for a lower portion thereof, so that a trench 360 is formed between the control circuit part 220 and the main circuit terminal 440. Forming the trench 360 results in a reduction in the amount of material needed for the mold compound 350, thereby lightening the weight of the power semiconductor module and lowering the manufacturing cost thereof.

Figure 2:
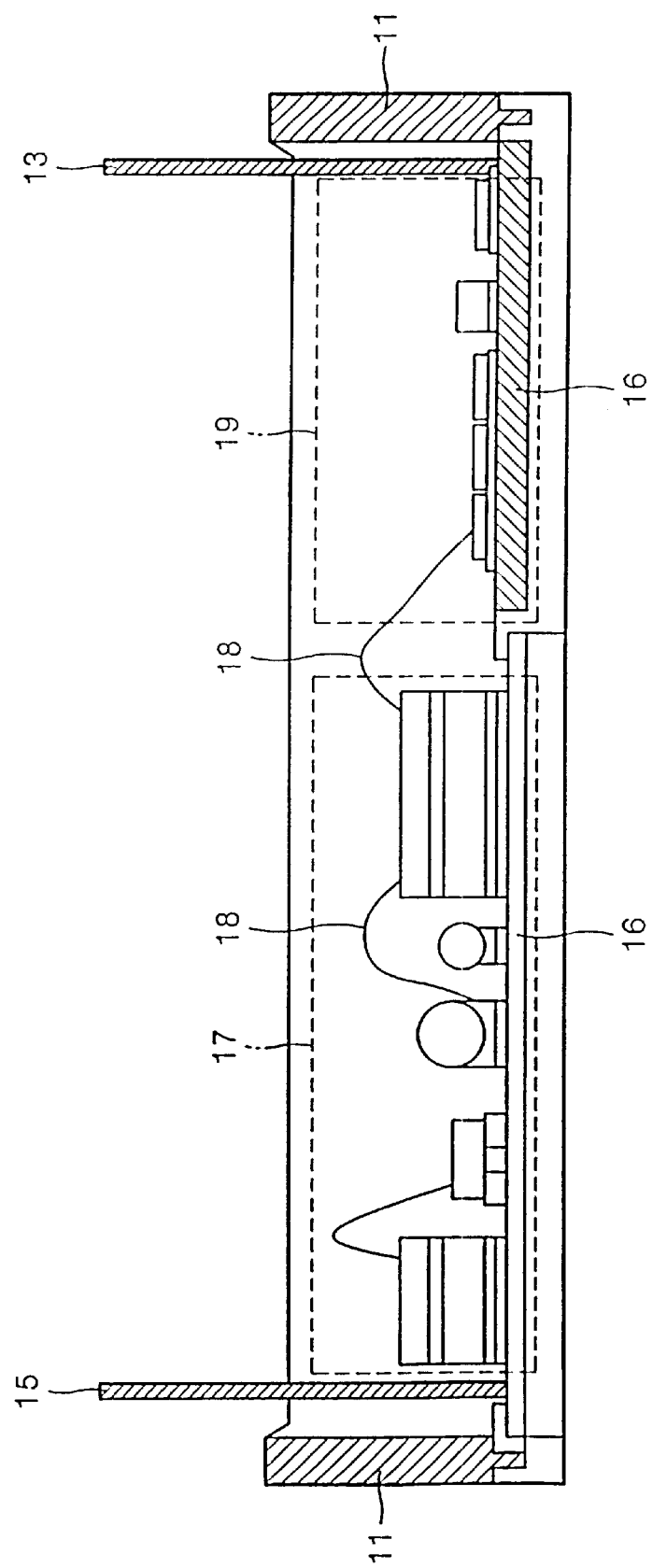
Figure 3:
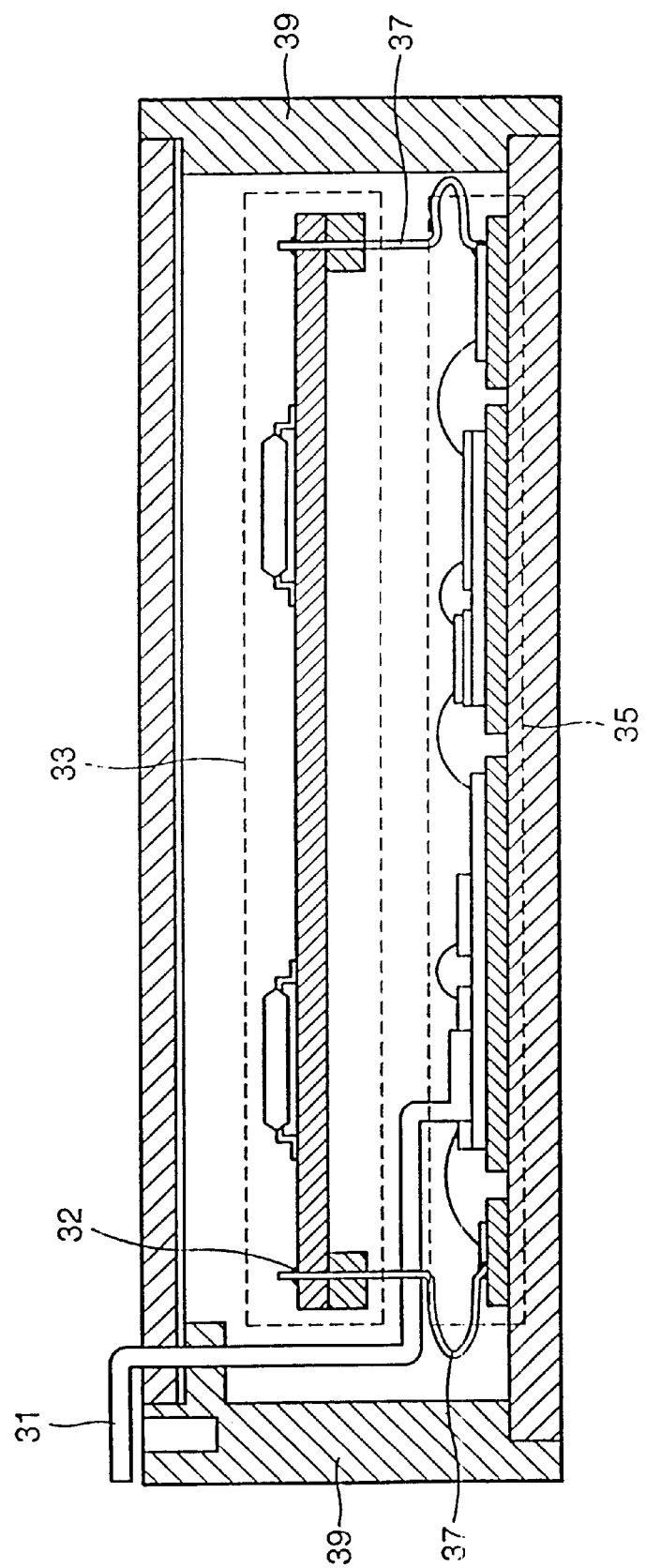

In conclusion, unlike the conventional power semiconductor modules shown in FIGS. 2 and 3, the size of an isolation substrate is small and no metal connections metals are required because only components related to a main circuit part are mounted on a power semiconductor module according to the present invention. Thus, it is possible to reduce the size and weight of the power semiconductor module and the manufacturing costs therefor. Further, a power semiconductor module according to the present invention uses a method of bending a lead frame, thus removing unnecessary components and processes as explained later with reference to FIGS. 4 through 13B. Accordingly, a process of fabricating the power semiconductor module can be simplified. Also, the size of a power semiconductor module according to the present invention is smaller compared with the conventional one shown in FIG. 1. Further, the isolation height h can be increased so that it satisfies the requirement of the UL (underwriters laboratory) standard providing that the height of isolation be 12.7 mm.

Hereinafter, a method of fabricating a power semiconductor module according to the present invention will be now described with reference to FIGS. 4 through 13B.

Figure 4:
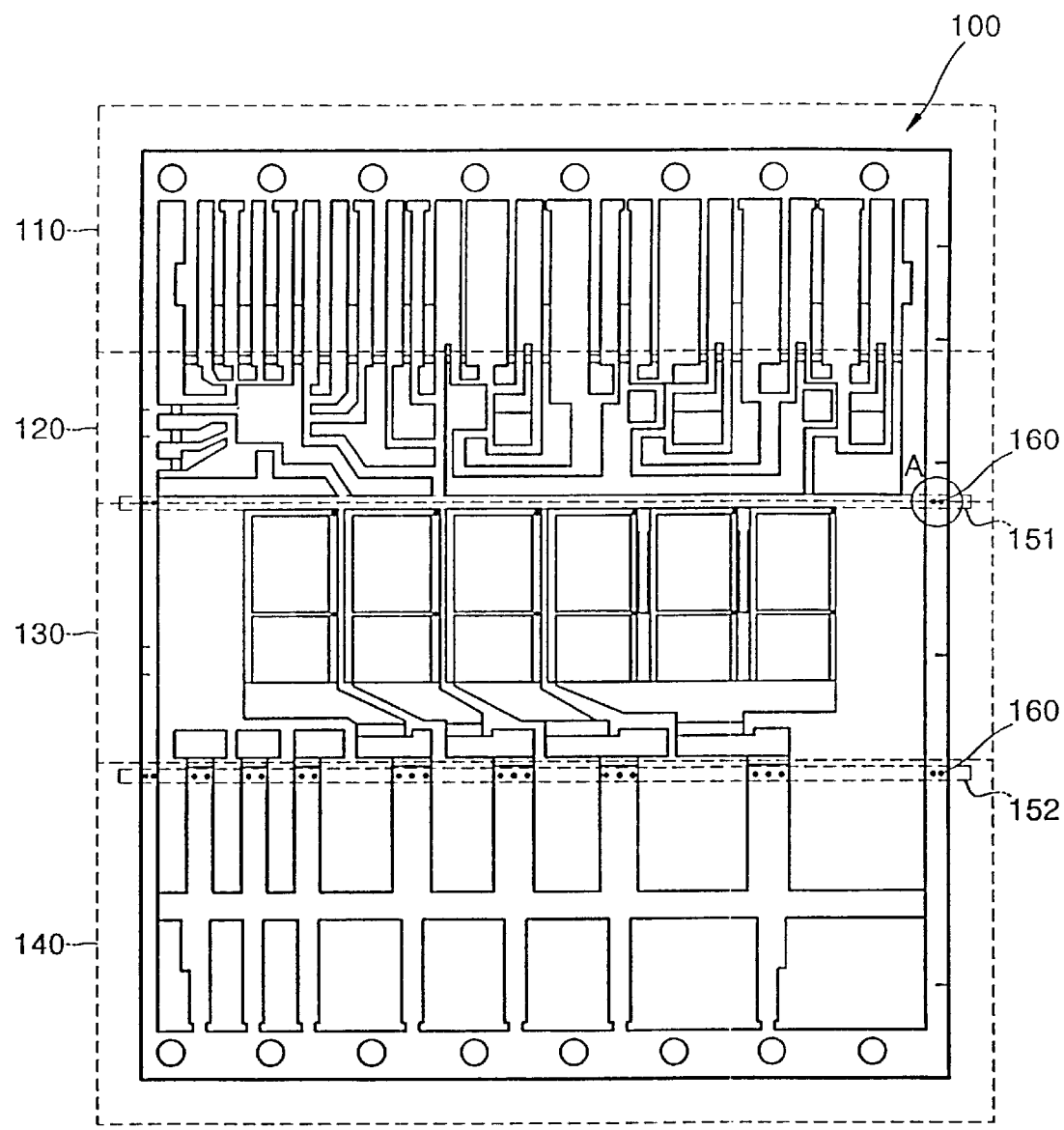
Figure 5A:
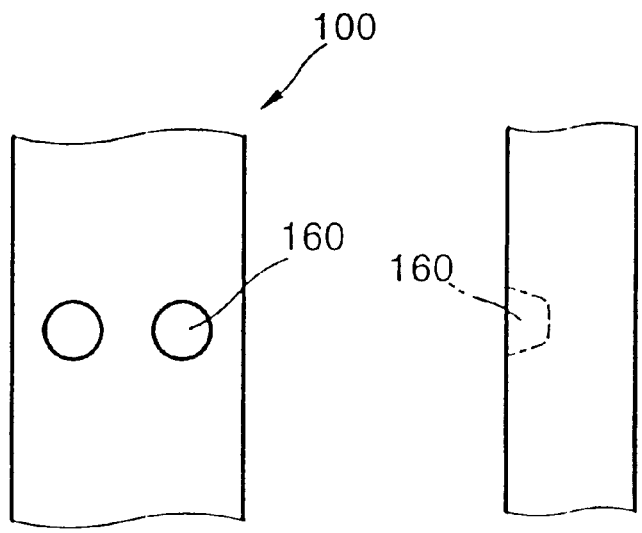
Figure 5B:
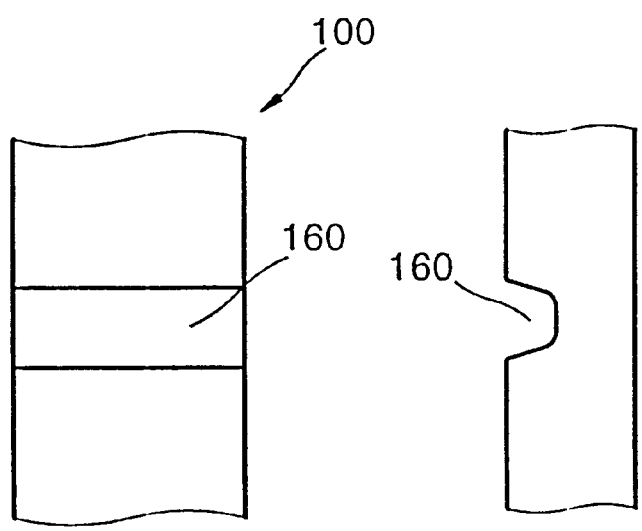

FIG. 4 is a plan view of a lead frame and FIGS. 5A and 5B are diagrams for explaining notches. In detail, FIGS. 5A and 5B are magnifications of embodiments of part "A" shown in FIG. 4. Referring to FIG. 4, a lead frame 100 having a notch 160 at first and second bending regions 151 and 152 is formed. The lead frame 100 is composed of a main circuit lead frame part 130, a control circuit lead frame part 120, a control circuit terminal lead frame part 110, and a main circuit terminal lead frame part 140.

A power semiconductor device (not shown) is attached to the main circuit lead frame part 130, and a control circuit device (not shown) is attached to the control circuit lead frame part 120. The control circuit terminal lead frame part 110 is connected to the control circuit lead frame part 120 and functions as a control circuit terminal. The main circuit terminal lead frame part 140 is connected with the main circuit lead frame part 130 and functions as a main circuit terminal.

The control circuit lead frame part 130 is bent at the first bending region 151, which is a border between the main circuit lead frame part 130 and the control circuit lead frame part 120. Also, the main circuit terminal lead frame part 140 is bent at the second bending region 152, which is a border between the main circuit lead frame part 130 and the main circuit terminal lead frame part 140.

First, the notch 160 is formed at the first and second bending regions 151 and 152 so that the control circuit lead frame part 130 and the main circuit terminal lead frame part 140 can be easily bent. The shape of the notch 160 may vary. For example, the notch 160 may be formed with dots at the first and second bending regions 151 and 152, as shown in FIG. 5A. Or, as shown in FIG. 5B, the notch 160 may be formed via a line at the first and second bending regions 151 and 152.

Figure 6:
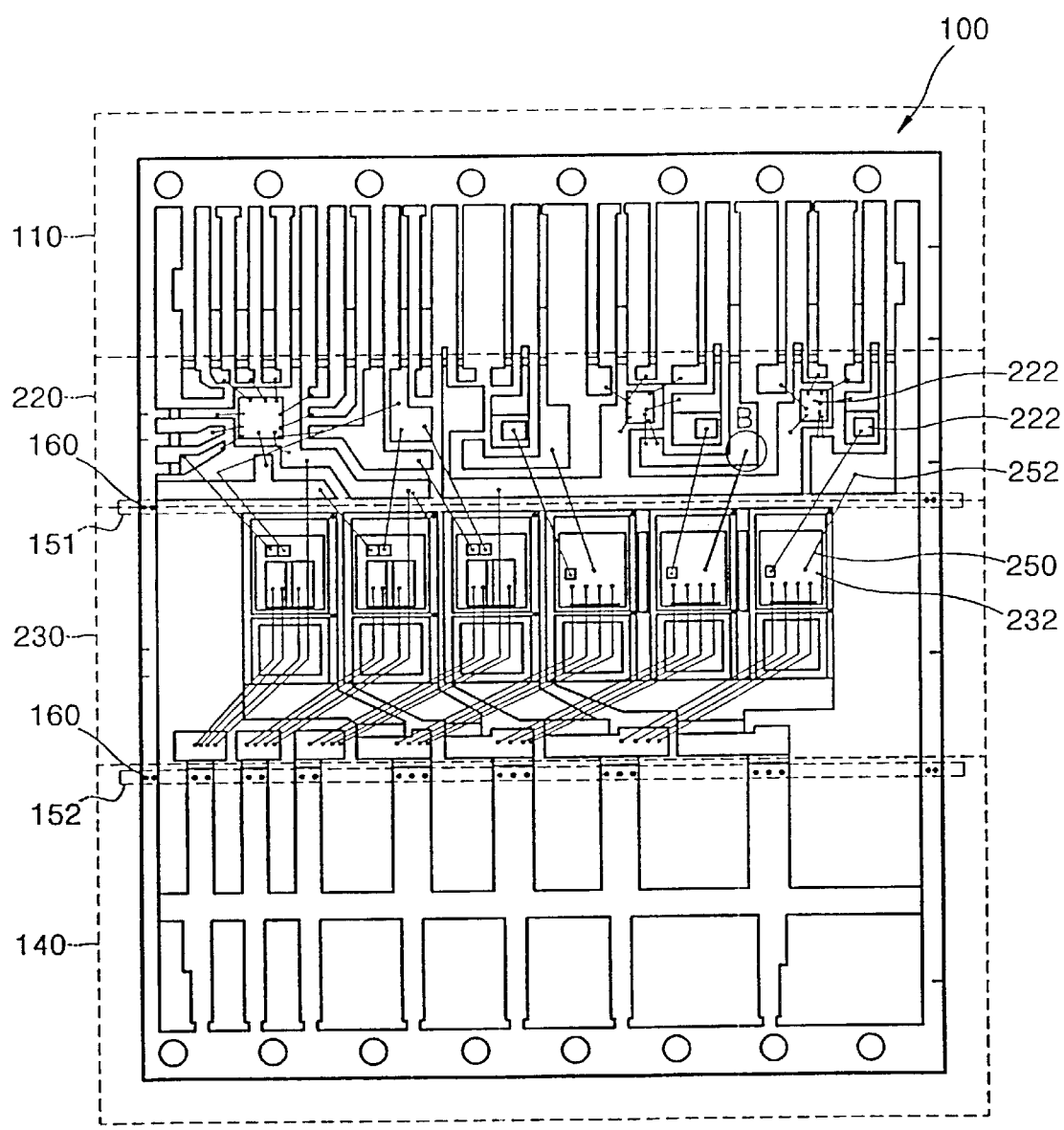

Thereafter, a power semiconductor device 232 and a control circuit device 222 are attached to the lead frame 100, and a bonding wire 250 is bonded thereon, as shown in FIG. 6. The control circuit part 220 is completed by attaching the control circuit device 222 to the control circuit lead frame part 120 shown in FIG. 4, and the main circuit part 230 is completed by attaching the power semiconductor device 232 to the main circuit lead frame part 130 shown in FIG. 4. The bonding wire 250 bonds the control circuit terminal lead frame part 110 to the control circuit device 222, the control circuit device 222 to the power semiconductor device 232, and the power semiconductor device 232 to the main circuit terminal lead frame part 140, for an electrical connection therebetween.

Figure 7:
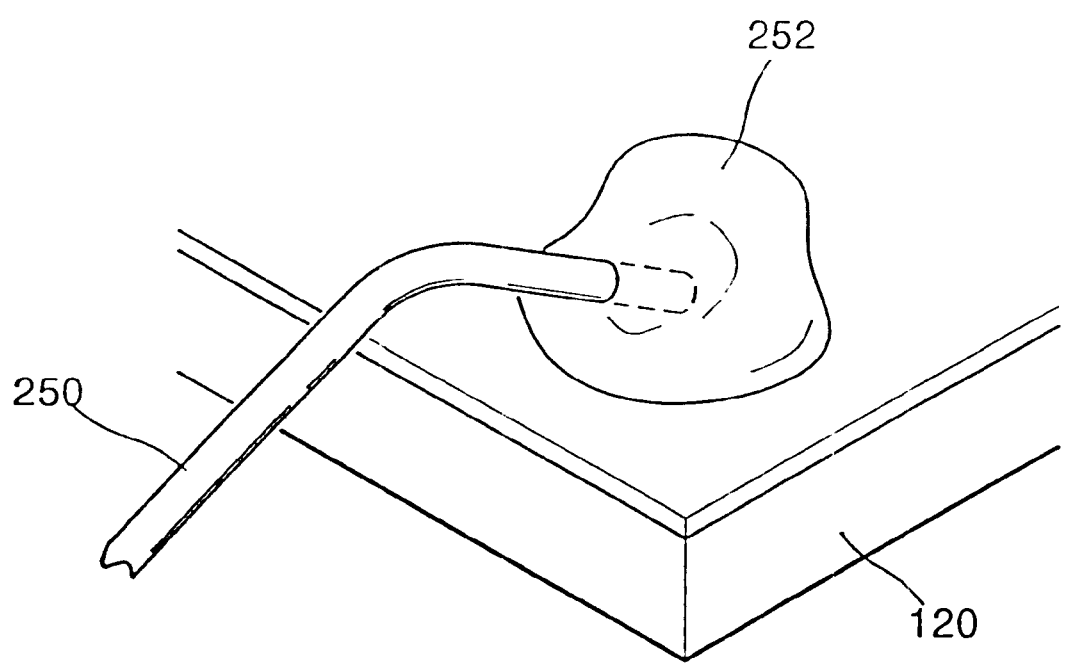

FIG. 7 is a magnification of part "B" shown in FIG. 6. Referring to FIG. 7, an impulse buffer agent 252 is formed on metal connections electrically connecting the bonding wire 250 and the control circuit lead frame part 110. The impulse buffer agent 252 is preferably formed at every end of the bonding wire 22, which is electrically bonded with other components. With the impulse buffer agent 252, it is possible to prevent the bonding wire 250 from detaching from the main circuit terminal lead frame part 140 or the control circuit lead frame part 120 when an impulse is imparted thereto. The impulse buffer agent 252 is preferably formed of a silicon-based rubber or polyamide.

Figure 8A:
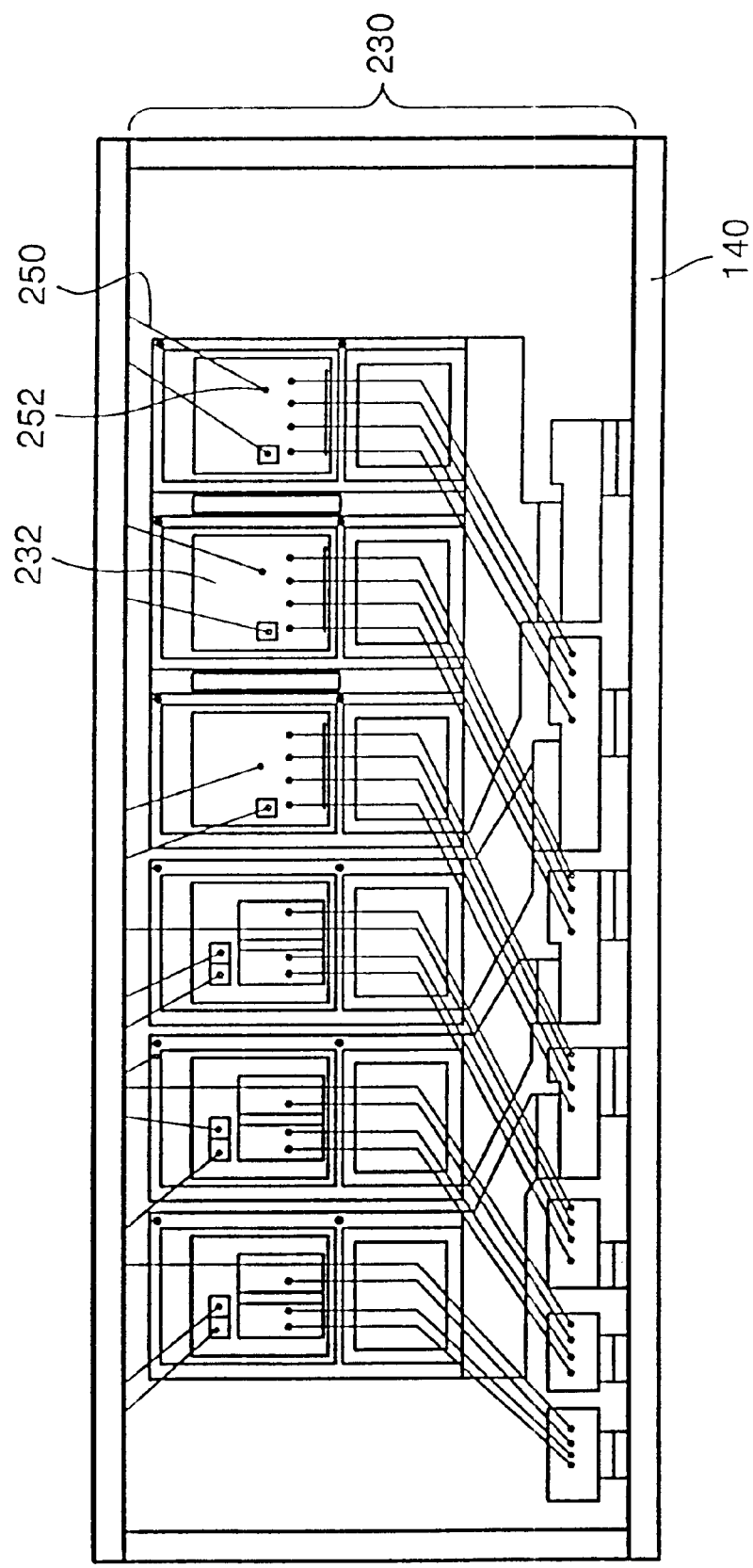
Figure 8B:
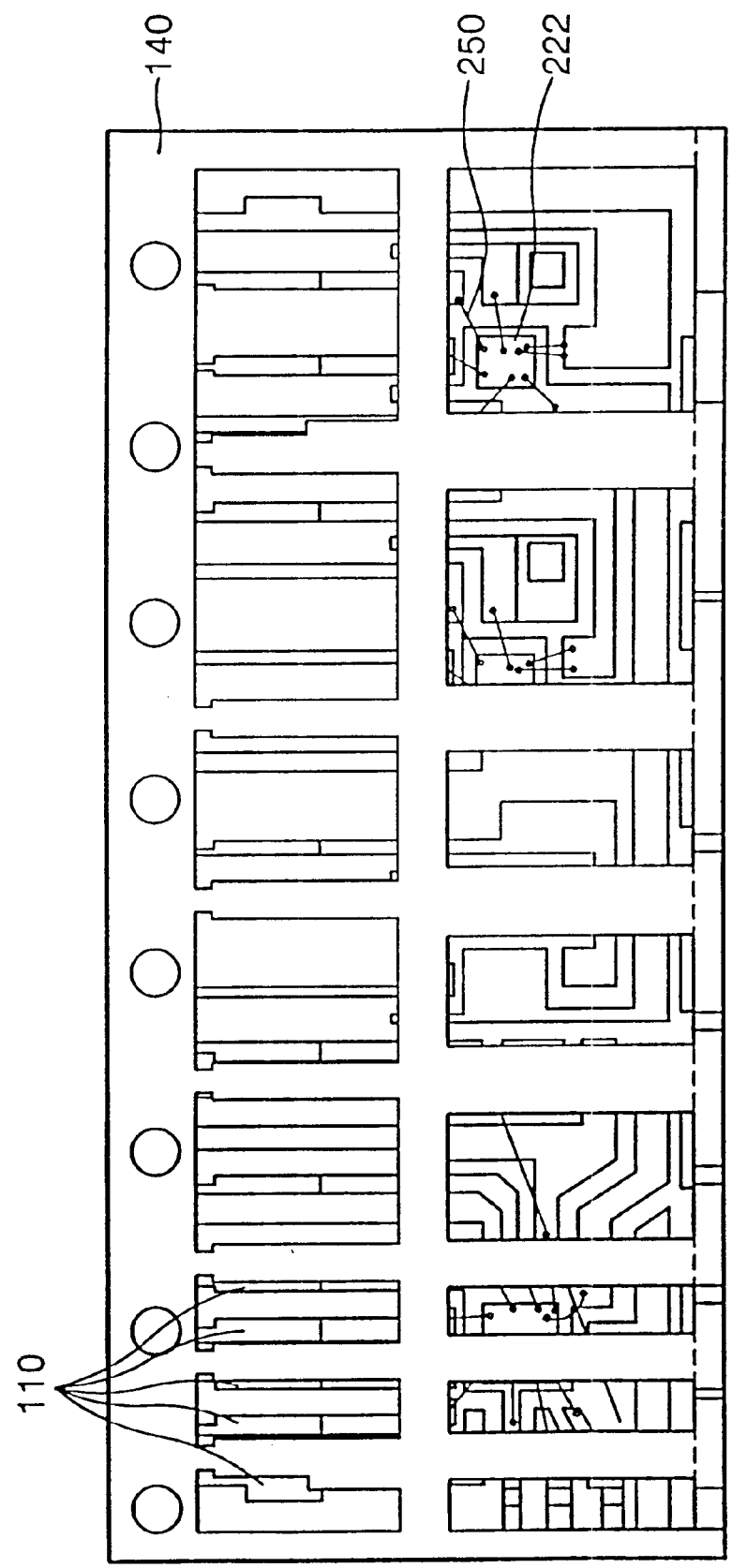
Figure 8C:
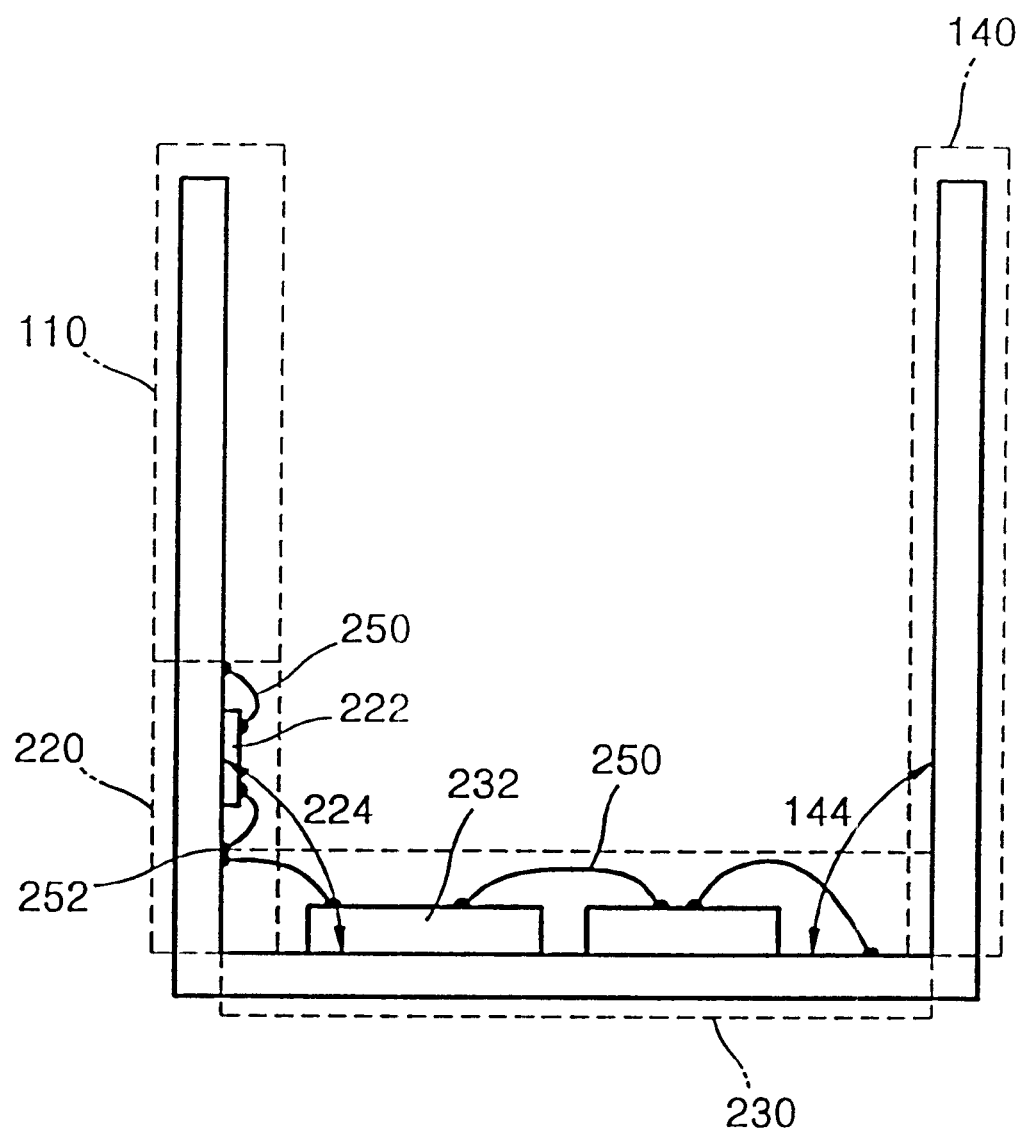

Next, as shown in FIGS. 8A through 8C, the control circuit part 220 is bent at the first bending region 151 shown in FIG. 6, and the main circuit terminal lead frame part 140 is bent at the second bending region 152. FIG. 8A is a plan view of the lead frame 110 in which the control circuit part 220 and the main circuit terminal lead frame part 140 are bent, FIG. 8B is a front view of the lead frame shown in FIG. 8A, and FIG. 8C is a cross sectional view of the left side of the lead frame shown in FIG. 8A.

Preferably, the control circuit part 220 is bent to form a right angle 224 (hereinafter, a 'first angle') to the main circuit part 230, and the main circuit terminal lead frame part 140 is bent to form a right angle 144 (hereinafter, a 'second angle') to the main circuit part 230. However, the control circuit part 220 and the main circuit terminal lead frame part 140 may be bent to form first and second angles 244 and 144 which are acute or obtuse. During the bending process, the first and second angles 224 and 144 are preferably at the same angle so that the control circuit part 220 and the control circuit terminal lead frame 110 are symmetrical to the main circuit terminal lead frame part 140 on the main circuit part 230.

Figure 9A:
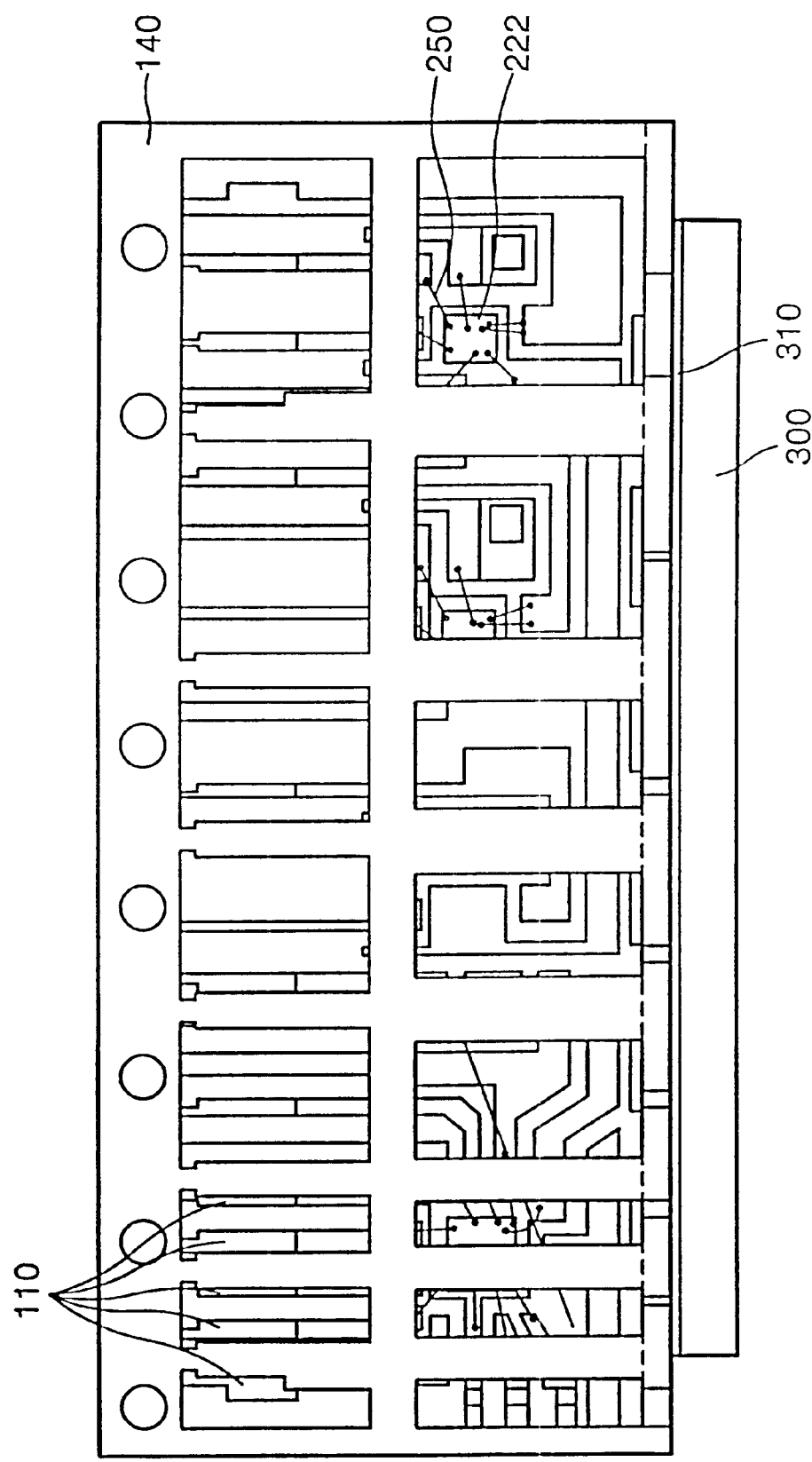
Figure 9B:
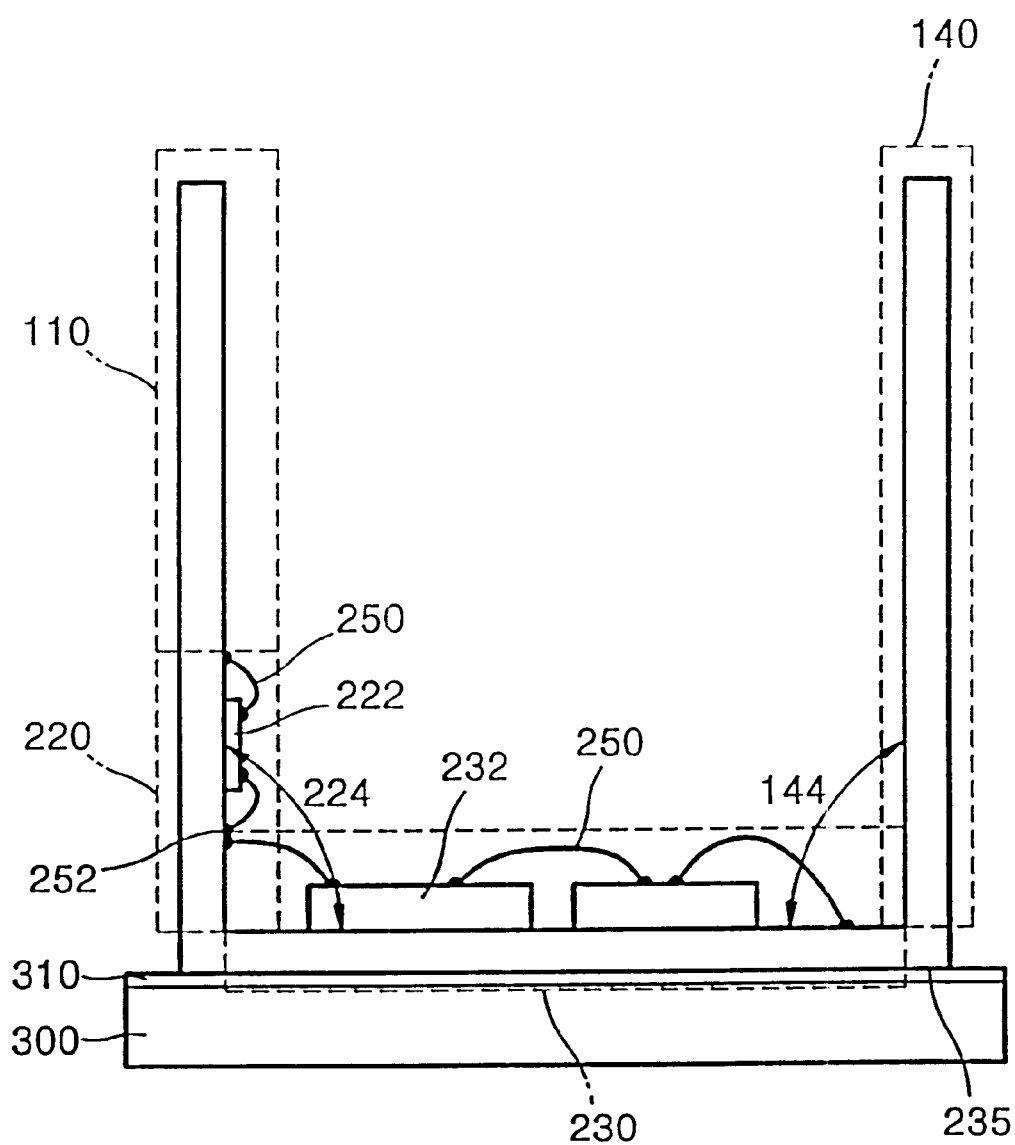

As shown in FIGS. 9A and 9B, the main circuit part 230 is mounted on the isolation substrate 300 so that its lower portion 235 is in contact with the isolation substrate 300. FIG. 9A is a front view of the lead frame 100 in which the main circuit part 230 is mounted on the isolation substrate 300, and FIG. 9B is a cross sectional view of the left side of the lead frame 100 shown in FIG. 9A. The lower portion of the main circuit part 230 may be in contact with the isolation substrate 300 via an adhesive 310. The width of the isolation substrate 300 is preferably larger than that of the main circuit part 230. In this power semiconductor module, the control circuit part does not need to be formed on the isolation substrate 300, thus reducing manufacturing cost and the weight of the power semiconductor module.

Figure 10A:
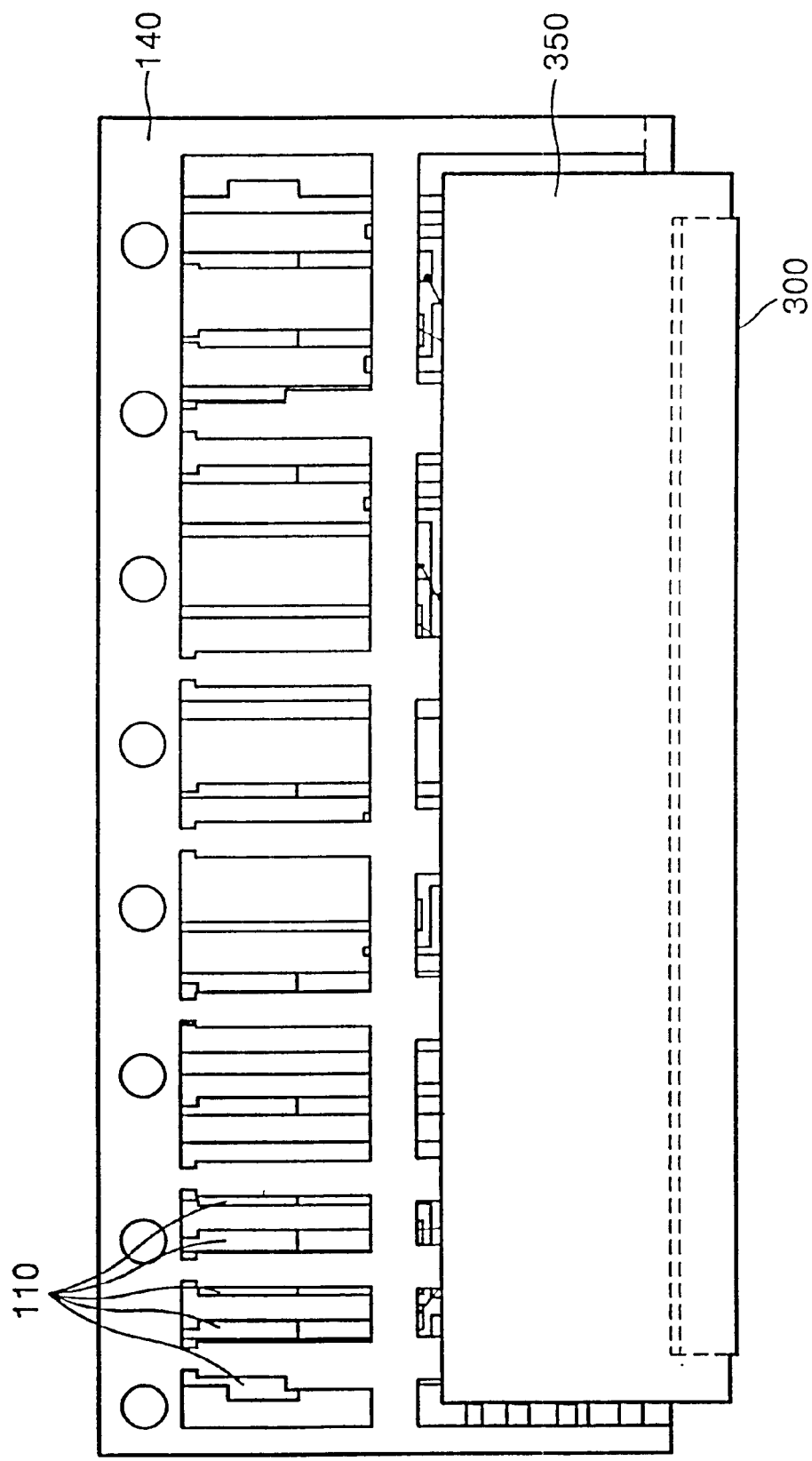
Figure 10B:
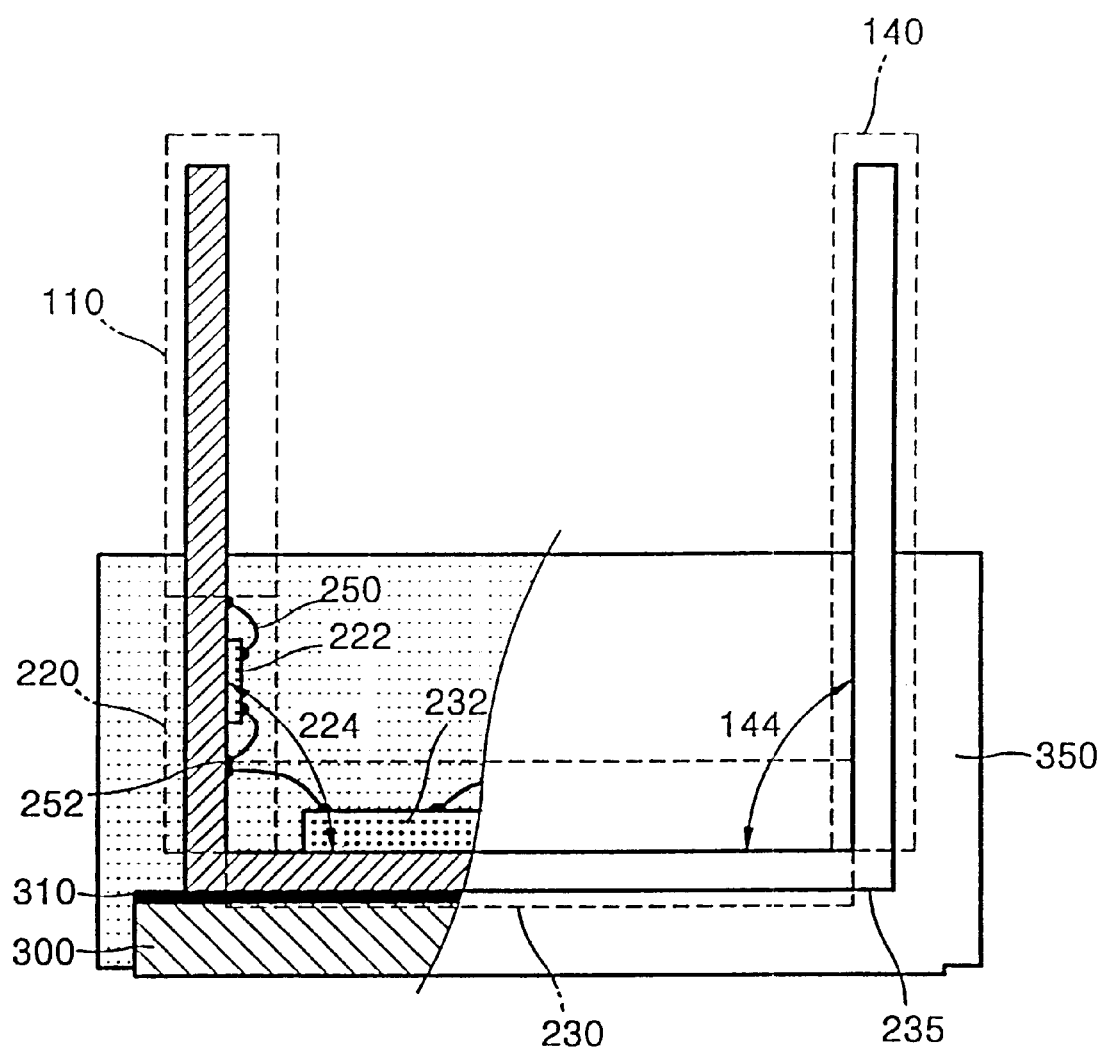

Next, as shown in FIGS. 10A and 10B, a molding process is performed on the main circuit part 230, the control circuit part 220, a portion of the main circuit terminal lead frame part 140, and the entire isolation substrate 300, excluding a portion that contacts a heat sink (not shown). FIG. 10A is a front view of the lead frame 100 in which a molding process is performed, and FIG. 10B is a cross sectional view of the left side of the lead frame 100 shown in FIG. 10A. The exterior of a power semiconductor module according to the present invention is shaped into a hexahedron by the molding process.

As shown in FIGS. 11A and 11B, the lead frame 100 is trimmed to form the control circuit terminal 410 and the main circuit terminal 440. FIG. 11A is a front view of the lead frame 100 in which a trimming process is performed, and FIG. 11B is a cross sectional view of the left side of the lead frame 100 shown in FIG. 11A.

Figure 12A:
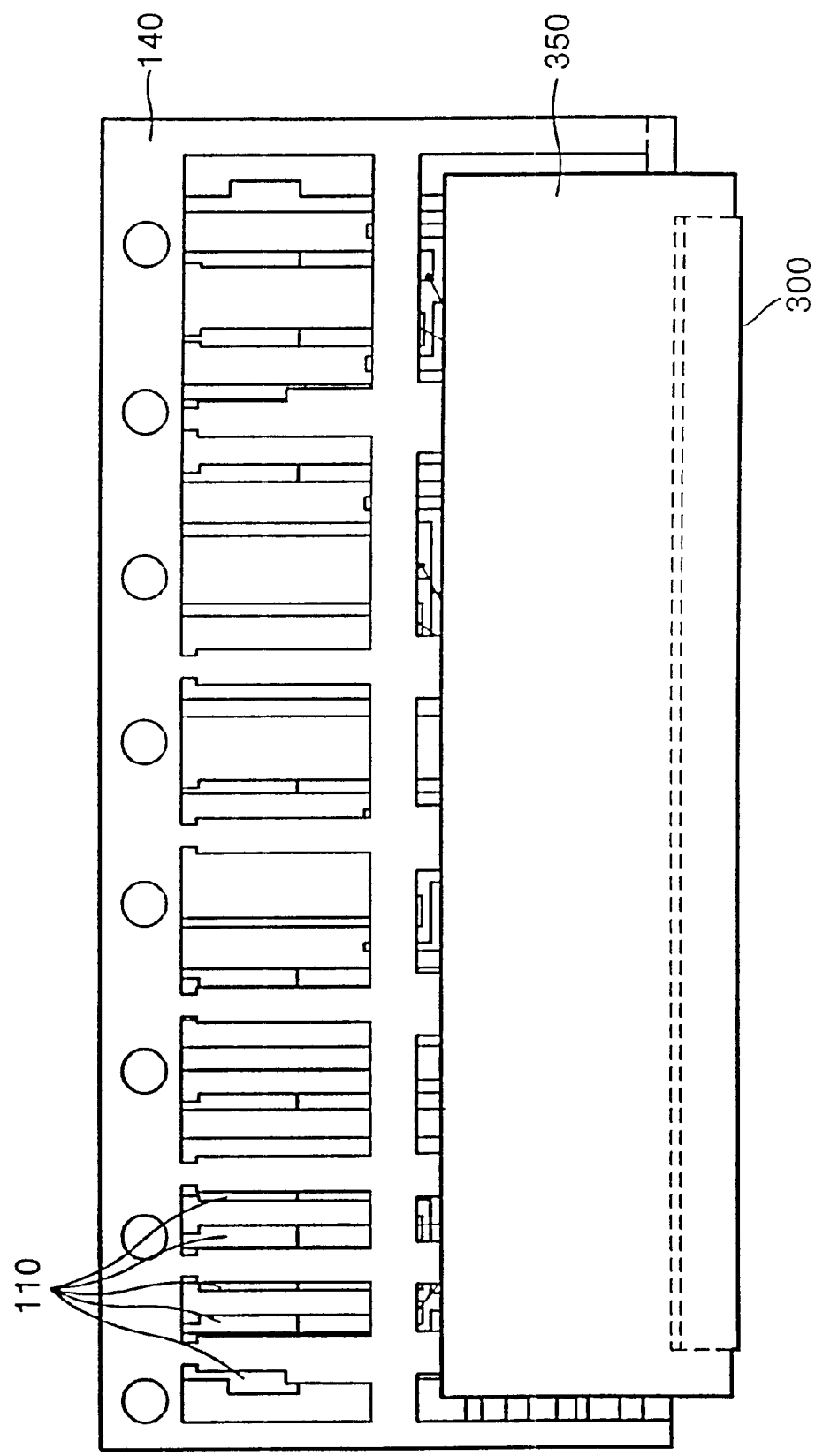
FIGS. 12A through 13B are views for explaining a method of fabricating a three dimensional power semiconductor module according to another preferred embodiment of the present invention and the structure thereof.

FIGS. 12A through 13B are views for explaining a method of fabricating a modified example of the embodiment of the power semiconductor module shown in FIGS. 11A and 11B. Compared with the previous embodiment, the processes of fabricating and bending a lead frame are the same for the modified examples, but a molding process is different. In other words, a lead frame is fabricated and then is bent as explained in the previous embodiment (refer to the descriptions for FIGS. 4 through 9B). FIG. 12A is a front view of the modified example of the power semiconductor module in which a molding process has been performed, and FIG. 12B is a cross sectional view of the left side of the power semiconductor module shown in FIG. 12A. Also, FIG. 13A is a front view of the power semiconductor module in which a trimming process has been performed, and FIG. 13B is a cross sectional view of the left side of the power semiconductor module shown in FIG. 13A.

Figure 12B:
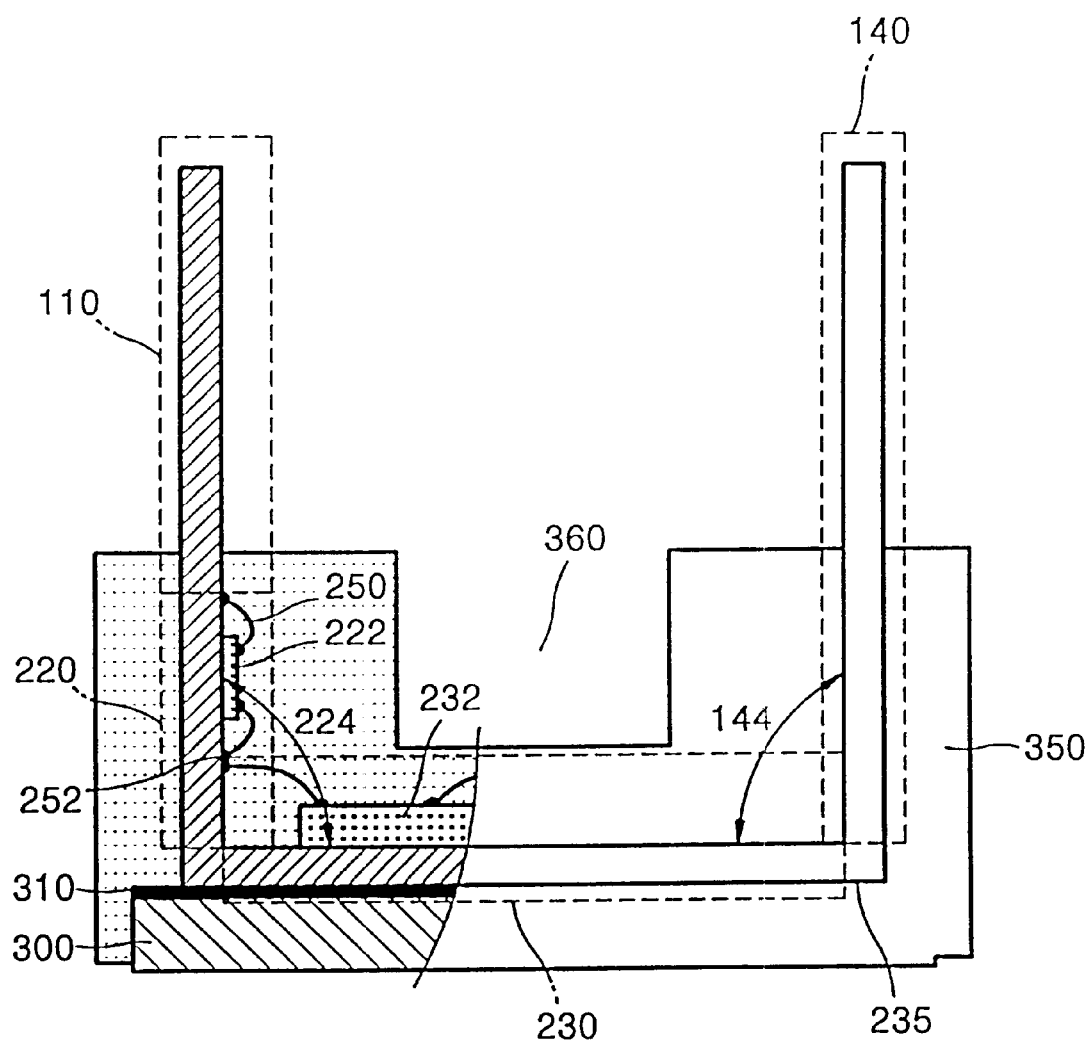

Referring to FIGS. 12A and 12B, the main circuit part 230, the control circuit device 220, a portion of the main circuit terminal lead frame part 140, and the entire isolation compound 300, excluding a portion contacting a heat sink (not shown), are molded by a mold compound 350 to form a trench 360 in a space formed by the control circuit part 230 and the main circuit terminal lead frame part 140. Next, the lead frame 100 is trimmed to form the control circuit terminal 410 and the main circuit terminal 440. It is possible to save trouble, time and costs needed in molding an unnecessary portion during the manufacture of the power semiconductor module by forming the trench 360, thereby reducing manufacturing costs.

A power semiconductor module according to the present invention is configured such that a main circuit terminal lead frame part and a control circuit lead frame part are bent from a main circuit lead frame part. As a result, only a portion corresponding to the main circuit part of the power semiconductor module is mounted on an isolation substrate, thereby reducing the size and weight of the power semiconductor module that is one package into which electronic components are integrated and reducing manufacturing cost therefor. Also, a process of fabricating the power semiconductor module can be simplified. Further, it is possible to sufficiently increase the height of an isolation between an outer connection terminal and a heat sink.

What is claimed is:

1. A three dimensional power semiconductor module comprising:
   an isolation substrate;
   a main circuit part mounted on the isolation substrate and including a power semiconductor device;
   a control circuit part positioned along a plane, forming an obtuse or acute angle to the main circuit part, the control circuit part including a control circuit device;
   a control circuit terminal connected to the control circuit part;
   a main circuit terminal positioned along another plane, forming a predetermined angle to the main circuit part;
   at least one bonding wire for electrically coupling at least two of the control circuit terminal, the control circuit device, the power semiconductor device, and the main circuit terminal together; and
   a mold compound encapsulating the main circuit part and the control circuit part.

2. The module of claim 1, wherein the main circuit part is attached to the isolation substrate by an adhesive.

3. A three dimensional power semiconductor module comprising:
   an isolation substrate;
   a main circuit part mounted on the isolation substrate and including a power semiconductor device;
   a control circuit part positioned along a plane, forming a predetermined angle to the main circuit part, the control circuit part including a control circuit device;
   a control circuit terminal connected to the control circuit part;
   a main circuit terminal positioned along another plane, forming a predetermined angle to the microcircuit part;
   at least one bonding wire for electrically coupling at least two of the control circuit terminal, the control circuit device, the power semiconductor device, and the main circuit terminal together; and
   a mold compound encapsulating the main circuit part and the control circuit part,
   wherein the control circuit part is positioned along a plane perpendicular to the main circuit part.

4. The module of claim 3, wherein the control circuit part is positioned so that the control circuit device included therein turns toward the main circuit part.

5. The module of claim 3, wherein the control circuit terminal is positioned along the same plane as the control circuit part.

6. The module of claim 1, wherein the main circuit terminal is placed along a different plane, making it symmetrical with the control circuit part with reference to the main circuit part.

7. A three dimensional power semiconductor module comprising:
   an isolation substrate;
   a main circuit part mounted on the isolation substrate and including a power semiconductor device;
   a control circuit part positioned along a plane, forming a predetermined angle to the main circuit part, the control circuit part including a control circuit device;
   a control circuit terminal connected to the control circuit part;
   a main circuit terminal positioned along another plane forming a predetermined angle to the main circuit part;
   at least one bonding wire for electrically coupling at least two of the control circuit terminal, the control circuit device, the power semiconductor device, and the main circuit terminal together; and
   a mold compound encapsulating the main circuit part and the control circuit part,
   wherein the main circuit part and the control circuit part are completely molded by the mold compound such that a trench is formed in a space between the control circuit terminal and the main circuit terminal.

8. A three dimensional power semiconductor module comprising:
   an isolation substrate;
   a main circuit part mounted on the isolation substrate and including a power semiconductor device;
   a control circuit part positioned along a plane, forming a predetermined angle to the main circuit part, the control circuit part including a control circuit device;
   a control circuit terminal connected to the control circuit part;
   a main circuit terminal positioned along another plane, forming a predetermined angle to the main circuit part;
   at least one bonding wire for electrically coupling at least two of the control circuit terminal, the control circuit device, the power semiconductor device, and the main circuit terminal together; and
   a mold compound encapsulating the main circuit part and the control circuit part,
   wherein an impulse buffer agent is formed at the ends of the bonding wire.

9. The module of claim 8, wherein the impulse buffer agent is formed of a silicon based rubber or polyamide.

10. A three dimensional power semiconductor module comprising; an isolation substrate;
   a main circuit part mounted on the isolation substrate and including a power semiconductor device thereon;
   a control circuit part placed along a plane perpendicular to the main circuit part such that a control circuit device turns toward the power semiconductor device included in the main circuit part, the control circuit part including the control circuit device;
   a control circuit terminal placed along the same plane as the control circuit part, the control circuit terminal connected to the control circuit part;
   a main circuit terminal positioned along a different plane perpendicular to the main circuit part, facing the control circuit part and the control circuit terminal,
   at least one bonding wire for electrically coupling at least two of the control circuit terminal, the control circuit terminal, the power semiconductor device, and the main circuit terminal together; and a mold compound for molding the main circuit part, the control circuit part, a portion of the main circuit terminal, and the isolation substrate, excluding the lower part of the isolation substrate, thereby conforming the module into a hexahedral shape.

11. The module of claim 10, wherein the main circuit part is bonded to the isolation substrate by an adhesive.

12. The module of claim 10, wherein an impulse buffer agent is formed at the ends of the bonding wire.

13. The module of claim 12, wherein the impulse buffer agent is formed of a silicon based rubber or polyamide.

14. A Three dimensional power semiconductor module comprising:

an isolation substrate;

a main circuit part mounted on the isolation substrate and including a power semiconductor device;

a control circuit part placed along a plane perpendicular to the main circuit part such that a control circuit device turns toward the power semiconductor device in the main circuit part, the control circuit part including the control circuit device;

a control circuit terminal placed along the same plane as the control circuit part and connected to the control circuit part;

a main circuit terminal placed along a different plane perpendicular to the main circuit part, facing the control circuit part and the control circuit terminal;

at least one bonding wire for electrically coupling at least two of the control circuit terminal, the control circuit device, the power semiconductor device, and the main circuit terminal together;

an impulse buffer agent at an end of the at least one bonding wire; and a mold compound encapsulating the main circuit part, the control circuit part, a portion of the main circuit terminal, and the isolation substrate, excluding a lower portion of the substrate, such that a trench is formed in a space between the control circuit part and the main circuit terminal.

15. The module of claim 14, wherein the main circuit part is bonded to the isolation substrate by an adhesive.

16. The module of claim 14, wherein the impulse buffer agent is formed of a silicon based rubber or polyamide.

17. A method of fabricating a three dimensional power semiconductor module comprising the steps of:

(a) making a lead frame comprising bending regions having notches, the lead frame including a control circuit terminal lead frame part, a control circuit lead frame part, a main circuit lead frame part, and a main circuit terminal lead frame part;

(b) attaching a power semiconductor device to the main circuit lead frame part;

(c) attaching a control circuit device to the control circuit lead frame part;

(d) electrically coupling the control circuit device and the power circuit device together using a wire bonding process;

(e) bending the lead frame part at the bending regions so that the control circuit lead frame part and the main circuit lead frame part are substantially perpendicular to each other;

(f) mounting the control circuit lead frame part on an isolation substrate; and then molding the lead frame and the isolation substrate; and (g) trimming the lead frame.

18. The method of claim 17, wherein the bending regions comprise:

a first bending region that is a border between the main circuit lead frame part and the control circuit lead frame part; and a second bending region that is a border between the main circuit terminal lead frame part functioning as a main circuit terminal and the main circuit lead frame part, the second bending region being connected to the main circuit lead frame part.

19. The method of claim 17, wherein step (b) further comprises forming an impulse buffer agent on the metal connections of the bonding wire after the wire bonding.

20. The method of claim 17, wherein in step (d) the control circuit lead frame part is mounted on the isolation substrate after soldering on the isolation substrate.

21. The method of claim 17, wherein after (c), the control circuit terminal lead frame part and the main terminal lead frame part are substantially parallel to each other.

* * * * *